US007426675B2

(12) United States Patent
Harrand

(10) Patent No.: US 7,426,675 B2
(45) Date of Patent: Sep. 16, 2008

(54) DYNAMIC RANDOM ACCESS MEMORY HAVING AT LEAST TWO BUFFER REGISTERS AND METHOD FOR CONTROLLING SUCH A MEMORY

(75) Inventor: Michel Harrand, Saint Egreve (FR)

(73) Assignee: STMicroelectronics S.A., Montrouge (FR)

( * ) Notice: Subject to any disclaimer, the term of this patent is extended or adjusted under 35 U.S.C. 154(b) by 252 days.

(21) Appl. No.: 11/018,864

(22) Filed: Dec. 21, 2004

(65) Prior Publication Data

US 2005/0185492 A1 Aug. 25, 2005

(30) Foreign Application Priority Data

Dec. 23, 2003 (FR) .................................. 03 15263

(51) Int. Cl.
*H03M 13/00* (2006.01)
*G11C 29/00* (2006.01)
(52) U.S. Cl. ..................................................... 714/763
(58) Field of Classification Search ................... 714/763
See application file for complete search history.

(56) References Cited

U.S. PATENT DOCUMENTS

| 4,287,575 | A | * | 9/1981 | Eardley et al. ............... 365/154 |
| 4,428,048 | A | * | 1/1984 | Berlin, Jr. .................... 713/600 |
| 4,523,314 | A | * | 6/1985 | Burns et al. .................. 714/765 |
| 4,541,076 | A | * | 9/1985 | Bowers et al. .......... 365/230.05 |
| 4,817,058 | A | * | 3/1989 | Pinkham ...................... 365/195 |
| 5,170,157 | A | * | 12/1992 | Ishii ............................. 345/28 |
| 5,509,138 | A | * | 4/1996 | Cash et al. .................... 711/170 |
| 5,659,711 | A | * | 8/1997 | Sugita ......................... 711/144 |
| 5,680,365 | A | | 10/1997 | Blankenship .......... 365/230.05 |
| 6,088,285 | A | | 7/2000 | Takasugi ................ 365/230.05 |
| 6,233,659 | B1 | * | 5/2001 | Cohen et al. ................. 711/153 |

FOREIGN PATENT DOCUMENTS

| FR | 2 801 388 | | 5/2001 |
| GB | 2 289 779 | A | 11/1995 |
| WO | WO 96/32674 | | 10/1996 |

* cited by examiner

*Primary Examiner*—Joseph D Torres
(74) *Attorney, Agent, or Firm*—Lisa K. Jorgenson; Thomas J. Satagaj; Seed IP Law Group PLLC

(57) ABSTRACT

A dynamic random access memory circuit including a memory plane composed of an array of memory cells arranged in lines and columns, and a line decoder, each line of the memory plane corresponding to a page of words. Two buffer registers are coupled with the memory plane for reading words in a page of the memory and for writing new words to a page of the memory, and the registers are used alternatively to access this memory plane. The buffer registers are dual-port memories and, moreover, the memory has an error correcting circuit allowing read-modify-write cycles applied to a group of n words within the same page. Whereby the reliability of the memory circuit is substantially increased and, moreover, an alternative solution to burn-in can even be offered. The invention also provides a method for controlling a dynamic memory having an error correcting code mechanism.

5 Claims, 12 Drawing Sheets

DYNAMIC RANDOM ACCESS MEMORY HAVING AT LEAST TWO BUFFER REGISTERS AND METHOD FOR CONTROLLING SUCH A MEMORY

BACKGROUND OF THE INVENTION

1. Field of the Invention

The present invention relates to the field of memories and in particular to dynamic random access memories (DRAM).

2. Description of the Related Art

DRAM memories are very popular because of the great storage capacity that they offer. On the other hand, they need periodic cooling and, moreover, they are much slower to access than static memories.

Increasing the bandwidth of dynamic memories has already been attempted. To this end, a known technique consists in associating registers or storages controlled by means of an adapted storage controller, to the memory plane buffer.

The French patent application entitled <<Procédé de commande de mémoire DRAM rapide et contrôleur adapté>> by M. HARRAND filed on Nov. 19, 1999 (application N° 99 14610 and published under N° 2 801 388) describes a method and a storage controller to control a dynamic memory comprising a memory plane made up of a network of memory cells and at least two buffer registers.

The French patent application entitled <<Mémoire DRAM rapide>> by M. HARRAND and D. DOISE, filed on Dec. 7, 1999 (application N° 99 15435 and published under N° 2 802 012) describes a structure of fast DRAM memory comprising a memory plane associated with at least two buffer registers for accessing to the memory plane and allowing memory read and write.

Although using buffer memories makes it possible to significantly increase the bandwidth of dynamic memories, it is still limited and much narrower than that of static memories. In spite of the improvements already made, increasing the bandwidth of dynamic memories is still a current concern.

This constitutes a first technical issue.

Moreover, it would be desirable to integrate an error correcting system into such dynamic memories, a system that, if possible, limits as much as possible the surface of silicon allocated to correcting mechanism.

This constitutes a second technical issue.

Lastly, improving the reliability of dynamic memories is another problem that is added to the preceding ones. Because of their huge success, dynamic memories tend to develop in a considerable way. Burn-in processes, and in particular those carried out by heating effect, are very effective to accelerate the ageing of these components, and to identify those that will prematurely break down. These processes are very expensive to implement for it is necessary to carry out package and temperature tests after burn-in for the principal defects (carrying time) are visible only with high temperature; however, the carriers of some packages (and not packages themselves) deteriorate when heated, which requires to frequently change the card used for this test.

It would be desirable to have an alternative technique to burn-in making it possible to remedy to the flaws of young dynamic memory components.

BRIEF SUMMARY OF THE INVENTION

One embodiment of the present invention is a new structure of a dynamic memory that makes possible to further increase the bandwidth compared to known structures.

Another embodiment of the invention provides a structure of a dynamic memory having an error correcting device requiring a particularly reduced surface for implementation thereof.

Finally, still another embodiment of the invention is an alternative technique to expensive dynamic memory burn-in techniques.

In one embodiment, the invention includes a memory circuit, such as a dynamic random access memory (DRAM) that comprises a memory plane made up of a network of memory cells arranged in lines and columns, and a line decoder. Each line of the memory plane corresponds to a page of words. At least two buffer registers are coupled to the memory plane and alternatively allow reading of words of a memory page and/or writing of new words in a memory page.

According to this embodiment of the invention, buffer registers are arranged with additional circuits in order to allow simultaneous reading and writing access.

Thus, on long read/write sequences within the same page, it is possible to ensure continuous reading and writing streams. As a result, the bandwidth of the dynamic storage increases significantly compared to known circuits.

In a preferred embodiment, the memory comprises an error correcting circuit connected to the output of the buffer registers and based on an error correcting code (ECC) applied to a group of n words within a single page.

An encoding circuit computes the ECC code corresponding to the group of n words to write. A control logic makes it possible to carry out cycles of reading-modifying-writing to the group contained in the buffer registers, after modification of the new words to be stored, received via the memory external interface.

The reliability of the dynamic storage is thus substantially increased by correcting isolated bit errors with only a slight increase in the silicon surface, without slowing down writing of a word of the group.

Preferably, the memory circuit comprises a correcting circuit for receiving the group of n words, a register for storing, after correction, said group of n words and a number of multiplexers allowing modification of a word within the group in response to a writing request received from outside and finally, an encoding circuit for recomputing a new correcting code based on said modified group before storage thereof in one of said buffer registers.

In a particular embodiment, each word is composed of a byte of eight bits and sixteen bytes are grouped in a set of 128 bits to which the error correcting code is applied.

As the error correcting system makes it possible to remedy to most of the errors relating to isolated cells, which correspond to typical flaws of memory components, it can be noted that the complete system, comprising the buffer registers arranged in order to allow simultaneous reading and writing access and the error correcting mechanism, can be used as an alternative technique to expensive burn-in processes.

Independently, the invention is also applicable to any memory, even those that are not of the DRAM type.

One embodiment of the invention is also a method for controlling a dynamic storage comprising the following steps:

receiving a request for reading or writing a new word in the memory, comprising a line address corresponding to the page of the new word, a column address corresponding to the position of the new word within the page, and, in the case of a writing operation, the new word to be stored, loading, if necessary, said page into one of said two buffer registers accessible simultaneously for reading and writing;

extracting said loaded page of the word group corresponding to the request by means of a read access;

applying an error correcting mechanism to said word group;

storing the corrected group of words, modifying, if necessary, one or more of said words in response to the write access requests submitted through the interface system;

computing a new error correcting code based on said word group before storing it in one of said buffer registers by means of a write access;

saving, if necessary, contents of the other buffer register in a memory page, so that it is available for the execution of the next request.

These various operations are paralleled by means of a pipeline so that a continuous stream of write and read data can be obtained.

A further embodiment of the invention, independently of the existence or of the structure of buffer registers, is a memory circuit including a memory plane made up of a network of memory cells organized in lines and columns, a line decoder and a column decoder, each line of said memory plane storing a page of words each corresponding to a unit of elementary information that can be read or written. The circuit comprises an error correcting system associated with said word group, which makes it possible to considerably reduce the surface of silicon occupied by the error correcting system.

BRIEF DESCRIPTION OF THE DRAWINGS

Other features, objects and advantages of the invention will be made clear when reading the following description and drawings, only given by way of nonrestrictive examples. In the accompanying drawings.

DETAILED DESCRIPTION OF THE INVENTION

Figure 1:
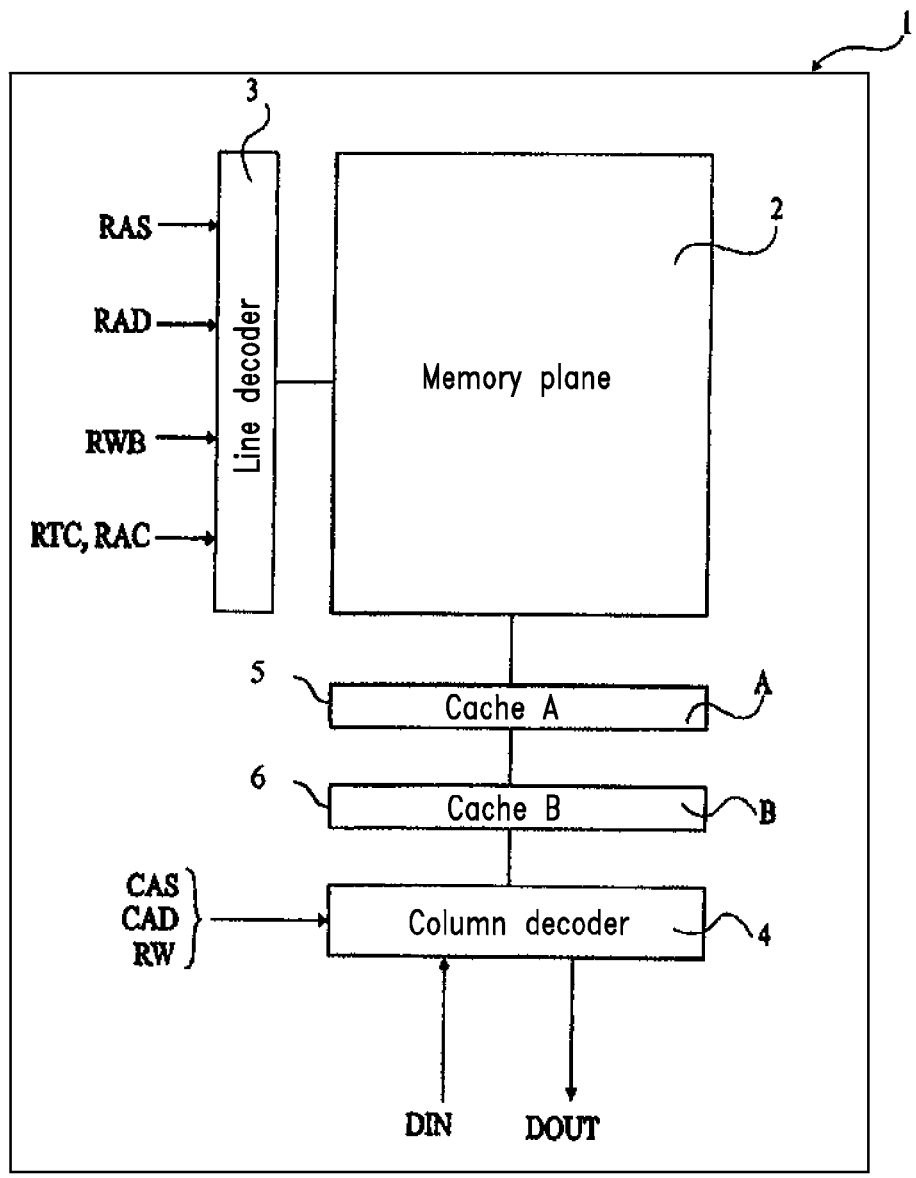
FIG. 1 illustrates the architecture of a dynamic storage based on two buffer registers or caches.

The memory structure of that will describe is an improvement of the dynamic storage described in the above-mentioned patent 2801388 whose contents are incorporated in here as reference.

For clarity's sake, the general structure of a DRAM memory comprising two buffer registers, as described in the above mentioned patent 2801388 will be briefly reminded. In reference to FIG. 1, there is a structure of a dynamic random access memory (DRAM) 1 that comprises a memory plane 2 made up of memory cells, a line decoder 3 and a column decoder 4. Each memory cell is located at the intersection of a line (or row) and a column (bit line). Amplifiers (not shown in the figure) give access the memory, in read, write or refresh phases. The column decoder comprises an input DIN for writes and an output DOUT for reads. Column Address Strobe (CAS) signals, Column Address (CAD) signals and read/write (R/W) signals are used to control the memory. The line decoder is controlled by Row Address Strobes (RAS) signals, Row Address (RAD) signals and by a Row-Write-Back signal (RWB).

Generally, the interface between the memory and inputs/outputs is carried out by means of an interface system making it possible to receive memory access requests. It is pointed out that requests comprise a Most Significant Bits (MSB) page address, a column address (Least Significant Bits), a R/W signal indicating if the request is a request for reading and writing, a signal of data DIN when it is a write request etc.

The line decoder is controlled by a Row Address Strobe (RAS) signal and a Row Address signal. Amplifier circuits (not represented) are positioned on each bit line, between the memory plane and the column decoder, and allow reading, writing and refreshment of memory cells.

Two buffer registers or caches, respectively 5 and 6, are located between the column decoder and memory plane 2 and are used to interface the memory plane and memory inputs/outputs. Fast-access memories are used to this end and a complete page of 1024 bits organized in words of 8 bits each (one byte) is stored in cache. Thus, data stored in memory plane 2 is accessible only via buffer registers 5 and 6 and a memory controller such as the one described in the above mentioned patent is then used to control all of the components of the dynamic memory. Lastly, two signals RTC and RAC allow selection of the buffer register to be used on access: 5, 6, or none (refresh).

Figure 2:
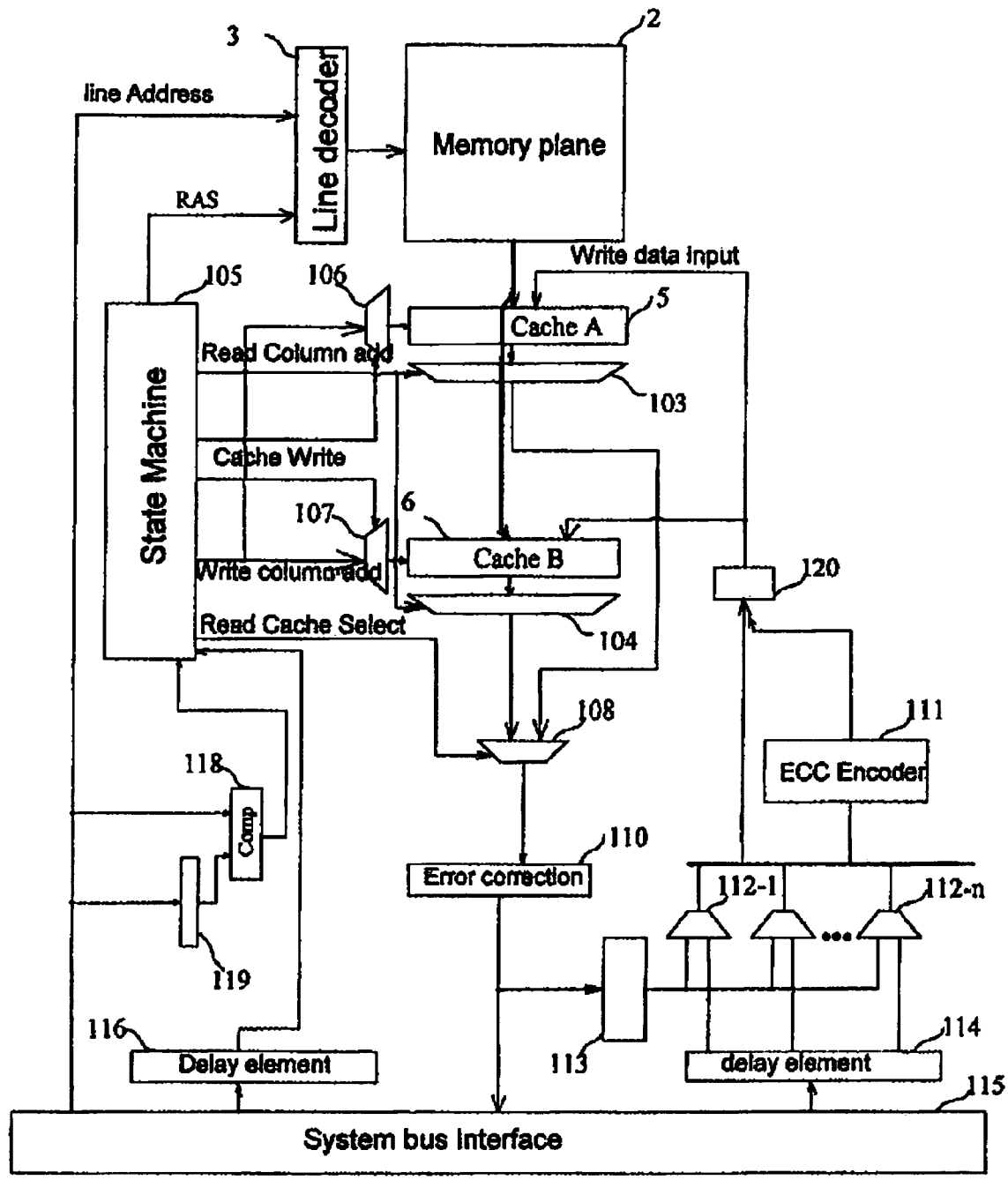
FIG. 2 shows a preferred embodiment of a dynamic storage, in accordance with the present invention, comprising an error correcting mechanism.

FIG. 2 illustrates the improvement brought to the memory of FIG. 1 in accordance with the present invention. The elements that are common with FIG. 1 keep the same numerical references as in FIG. 1, in particular memory plane 2, line decoder 3 and cache memories 5 and 6 for storing complete pages. An interface 115 is used for input and output transfers. Delay elements 114 and 116 are used to delay input data to memory interface in order to allow the memory controller to perform the various accesses necessary to caches registers.

In the memory structure of the invention, buffer registers 5 and 6 are arranged in order to allow simultaneous read and write access. Preferably, circuits allowing simultaneous submission of a read column address and/or a write column address are arranged around registers 5 and 6.

As a result, the memory plane is connected directly to the buffer registers without column decoder. FIG. 2 does not have a standard column decoder 4 that was shown in FIG. 1. The column decoder is disposed after the buffer registers: it is composed of a set of multiplexers 103, 104 and 108 that will be described hereafter.

Therefore, buffer registers 5 and 6 are equivalent to a dual-port memory—previously unknown in the case of dynamic memories—and, in the case of burst accesses to the same page a continuous read and write stream can thus be ensured, as will be explained more particularly in relation to chronograms of FIGS. 4-8.

Thus, the invention provides a DRAM whose operation resembles that of a dual-port memory.

Buffer registers 5 and 6 can be realized in various ways, and in particular in the form of traditional flip-flops. By way of non-restrictive examples, three different embodiments will be successively considered in order to show the great diversity of possible embodiments.

Figure 3A:
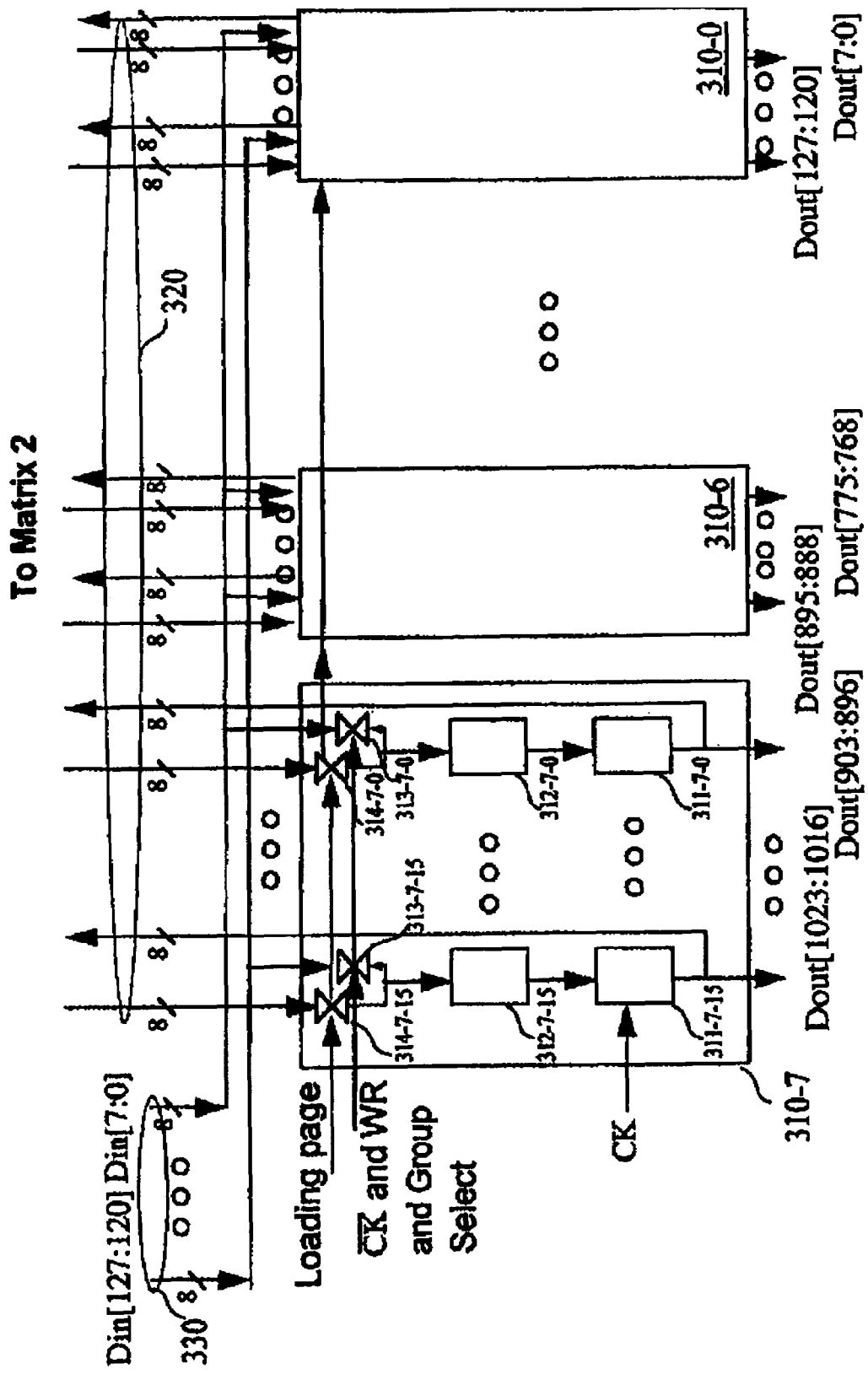
FIGS. 3A, 3B and 3C illustrate three embodiments of buffer registers 5 and 6.

FIG. 3A illustrates a first embodiment of buffer register 5 or 6. Register 5 comprises a set of blocks 310-*i* (with i varying from 0 to 7 in the example considered) each having the width of a word group, for example 128 bits. Each block 310-*i* comprises sixteen pairs of registers of eight bits each, respectively 311-*i-j* and 312-*i-j* (with j varying from 0 to 15), assembled in a master/slave flip-flop structure. The input of a master register receives a word $D_{in}$ to load either from the interface or from matrix 2.

For clarity's sake, only block 310-7 is detailed in FIG. 3A. As can be seen, block 310-7 comprises a first pair of 8-bit registers, respectively 311-7-0 and 312-7-0. Master register 312-7-0 receives the 8-bit word to store, either from a bus 330 ($D_{in}$) via a first switch 313-7-0, or from memory matrix 2 via an interface 320 and a second switch 314-7-0. Slave register 311-7-0 is connected to an output interface $D_{out}$ (via multiplexers 103 (resp. 104) and 108 of FIG. 2, not shown in FIG. 3) or to matrix 2 via interface 320 (for a WRITE BACK operation).

Similarly, block 310-7 comprises a sixteenth pair of registers 311-7-15 and 312-7-15, assembled in a master/slave structure too, and associated with two switches 313-7-15 and 314-7-15 allowing reception of a byte from memory matrix 2 and from bus 330, respectively.

Switches 314-*i-j* are all activated upon occurrence of a page load signal in order to allow loading of the 1024 bits contained in a single page of memory matrix 2.

Switches 313-*i-j* are activated when there is simultaneously a low clock signal, a write signal (WRITE) and a signal for selecting a particular group i. (among the eight possible groups in the considered example).

Figure 3B:
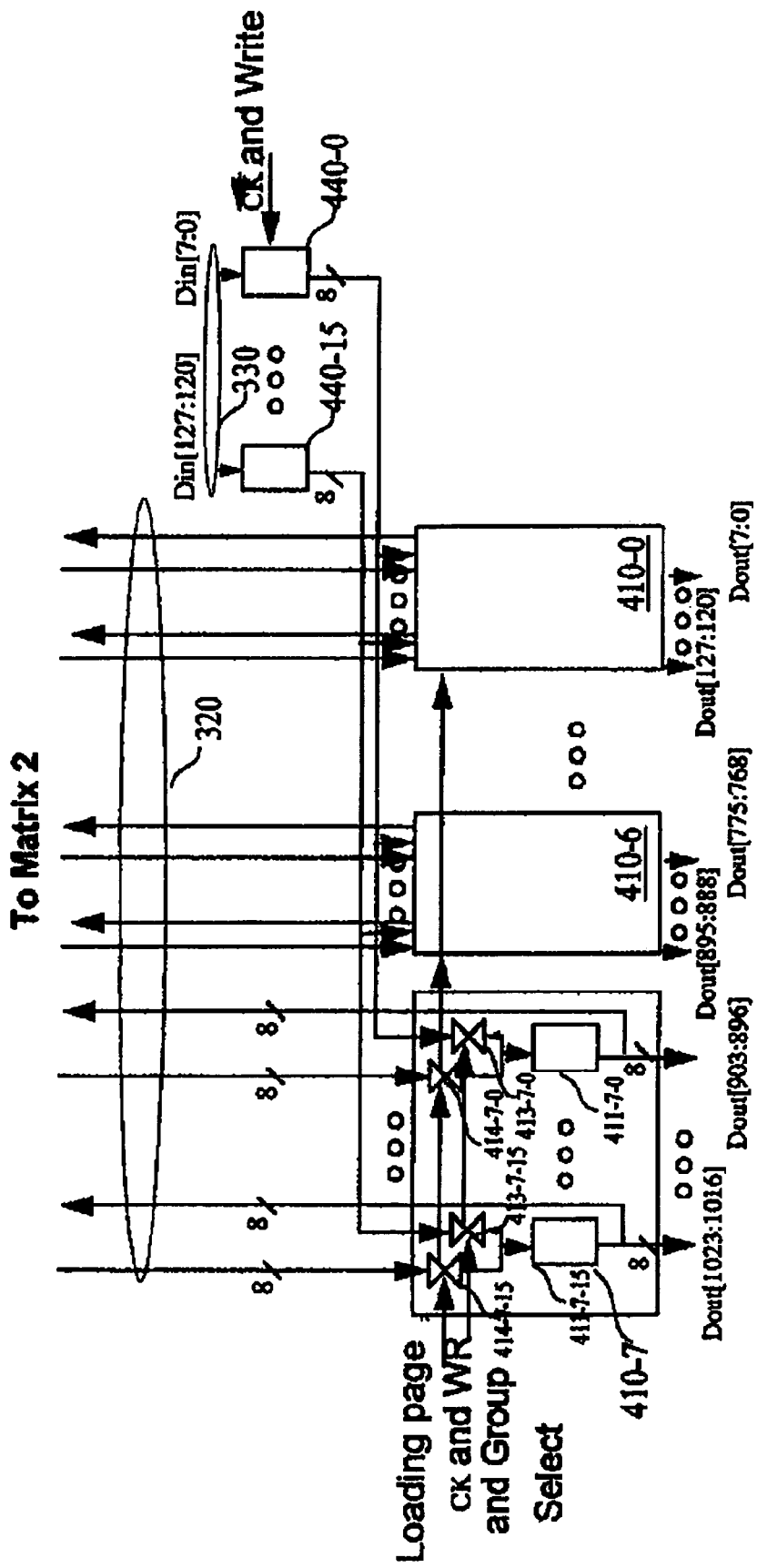

FIG. 3B corresponds to a particularly advantageous and therefore preferred embodiment of buffer registers 5 and 6 of FIG. 2. As previously, each register comprises a set of eight blocks 410-0 to 410-7, each comprising sixteen registers 411-*i-j*—assembled as slave flip-flops—associated with two switches 413-*i-j* and 414-*i-j* for receiving data either from interface 330 ($D_{in}$) or from matrix 2 via interface 320.

In this second embodiment, there is a set of master flip-flops—440-0 to 440-15—which are common to bits of the same row for all the words of one page.

The set of master flip-flops 440-0 to 440-15 then constitutes an input register—represented by element 120 on FIG. 2—having the width of a word group (i.e., 128 bits) and composed of simple flip-flops. The group formed by this 1-word register and one of the buffer registers then behaves as if the buffer register were composed of master-slave flip-flops, the master flip-flop 322 being in the input register and the slave flip-flop 321 in the buffer register. This solution has the advantage of reducing the occupied silicon surface.

Figure 3C:
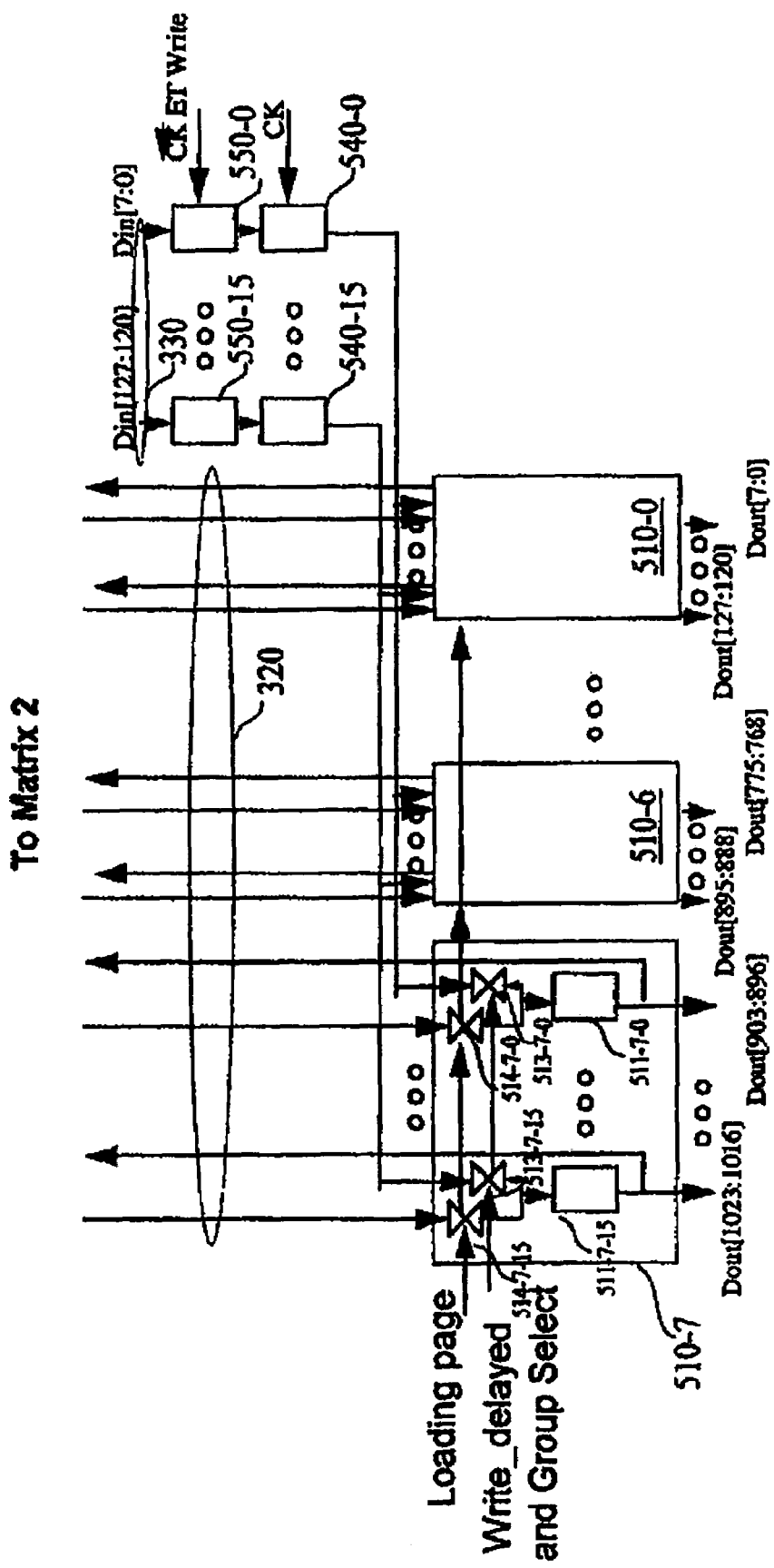

FIG. 3C finally illustrates a third embodiment of the buffer registers comprised of blocks 510-*i* (i varying from 0 to 7) comprising a single flip-flop 511-*i-j* (for example flip-flop 511-7-15), at the input of which (in register 120 of FIG. 2) is associated a master-slave register 540-*j* and 550-*j,* such as registers 540-15 and 550-15 that are controlled by signals CK and WRITE. Switches 513 and 514 are identical to switches 413 and 414 of the preceding figure. This solution may allow reduction of data set-up time compared to the embodiment of FIG. 3B, but requires the addition of a buffer write cycle in the chronograms described hereinafter. In this case, it is necessary that such writing be made at the same time as a buffer register write back cycle starts, which is possible in practice, since buffer writing takes little time, and since, when rewriting a buffer in a matrix, a certain number of operations can be performed before needing to write data.

It should be noted that, for clarity's sake, FIGS. 3A, 3B and 3C describe only the buffer registers structure regarding the load of data to be stored. It is clear that when an error correcting code—such as the one that will be described hereafter—is used, it is then necessary to plan ECC bit reads and writes for each word group. The numbering of the bits indicated in FIGS. 3A, 3B and 3C does not take into account the existence of the 8 or 9 bits (for each word group) assigned to the correcting code in order not to complicate the figure. It is clear that people qualified in the art will readily apply a dual structure for ECC with one control and such dual structure will not be further developed hereafter.

Depending on the way buffer registers 5 and 6 are realized, it may not be possible to read and write simultaneously to the same address of the same register. In this case, a mechanism can be incorporated within state machine 105 to check if a write request concerns the same address as the preceding request (or the one before the preceding one, according to the pipeline selected) in the same burst, which can be made using a column address comparator and address registers. If this is the case, then preceding data will not be read again, but rather the preceding result will be used.

Returning to FIG. 2, we will now describe another improvement that offers a particularly important advantage since it makes it possible to introduce an error correcting mechanism into the memory while requiring only slightly more of the silicon surface for this correcting mechanism.

To this end, buffer registers 5 and 6 are arranged to each store one page of 1024 bits comprising 8-bit words, and the words are grouped to form units of 128 bits—hereafter called word groups—to which an error correcting mechanism can be advantageously applied. In the described example, page organization into word groups made up of 128 bits is a perfectly arbitrary choice—just as is the choice of the error correcting code—and it is clear that people qualified in the art could readily adapt the teachings of the invention to any different organization.

As can be seen in FIG. 2, buffer register 5 is associated with a multiplexer 103 that makes it possible to select a word group made up of 128 bits plus an error correcting code (ECC) within the 1024-bit page. To this end, multiplexer 103 receives a write column address signal from a state machine 105 At the output of multiplexer 103, the 128 bits (plus the ECC) are transmitted to a first input of a multiplexer 108 controlled by a write cache select signal, also generated by state machine 105. Similarly, buffer register 6 is associated with multiplexer 104 that is controlled by a column address signal also generated by state machine 105. At the output of multiplexer 104, the 128 bits (plus ECC) are transmitted to a second input of multiplexer 108 for read cache selection.

Write column addresses are transmitted to buffer registers 5 and 6 via two decoders, respectively 106 and 107.

The output of multiplexer 108 is transmitted, via an output amplifier of the DRAM macrocell (not shown) to an error correction circuit 110 that outputs 128-bit data that is in theory free from error, which is then transmitted to a register 113 for storage.

The output of register 113 is connected to a first input of an array of n multiplexers, respectively 112-1 with 112-*n*. The n multiplexers make it possible to compose a new set of 128 bits while taking into account, if necessary, one or more words (or bytes in our example) that could have been modified by the bus system interface, via interface 115 and delay element 114. The output of the n multiplexers 112-1 to 112-*n* is transmitted to an ECC encoder 111, which allows generation of a new error correcting code that will then be concatenated with the 128 bits (in the example considered) before storage in register 120 (which corresponds to the input flip-flop of the buffer registers described more specifically in FIGS. 3A, 3B or 3C, according to the case), then in one of the buffer registers.

As it is possible to write a modified word group to a buffer register while reading another word group in the same register (or the other buffer register), these operations can be pipelined so that a word group or a sub-assembly of this group can be written in each clock cycle. Thus, the ECC does not penalize write-time, as would be the case in a system using only one access port to buffer registers.

Thus, the memory structure described in reference to FIG. 2 allows modifications—one word or more—within a word group, while allowing computation of a new error correcting code via encoder 111. Whereby the silicon surface allocated to the error correcting mechanism can be considerably reduced since, for a 128-bit word, a single 8-bit code is enough whereas 4 words of 6 bits each would be necessary if error correction were directly carried out on 32-bit words.

Thus, as can be seen, an effective mechanism can be introduced while minimizing the surface of silicon allocated to this mechanism.

Generally, state machine 105 provides all the signals necessary to control the previously mentioned multiplexers, as well as column address signals and the CAS signals. As people qualified in the art know how to generate such control signals, for simplicity, such generation will not be explained furthermore.

The structure finally comprises a memory element 119 for storing the MSB page address preceding the current request, and a comparator 118 for comparing the current request page address with the preceding page address. Request signals, READ/WRITE and WAIT (the latter slowing down the system in the event of too short a burst, for example) are not shown in the figure. The result of the comparison is provided to state machine 105, which can then generate memory control signals and, in particular, cause access to a new page in memory plane 2. In the event of successive requests concerning a page already stored in one of buffer registers 5 and 6, no new access to memory plane 2 is required. On the other hand, if the page address (MSB) of the current request is different from the preceding one, which is determined by comparator 118, then state machine 105 causes a new access to the memory plane by means signal RAS and causes transfer of the contents of the considered page to one of the buffer registers.

Signal RAS is transmitted to line decoder 2. As it is known, when signal RAS becomes low, a line of the memory plane becomes accessible for loading of one of buffer memories or caches 5 or 6. Once data has been transferred in one of the registers, the memory returns to its preload state and waits for a new memory access.

Generally, delay elements, such as elements 114 and 116, are inserted between memory and memory interface 115 for delaying processing of the column address (CAD) of a request compared to the page address (RAS) of the request.

An example of realization, based on shift registers, is described in the above-mentioned patent and will therefore not be further developed. The delay will be precisely set according to the access time to the considered memory plane. Refresh mechanisms will also be set in order to allow periodic refresh of the memory plane.

The operation of the memory structure will be better understood in relation to the description of chronograms of FIGS. 4 to 8.

Figure 4:
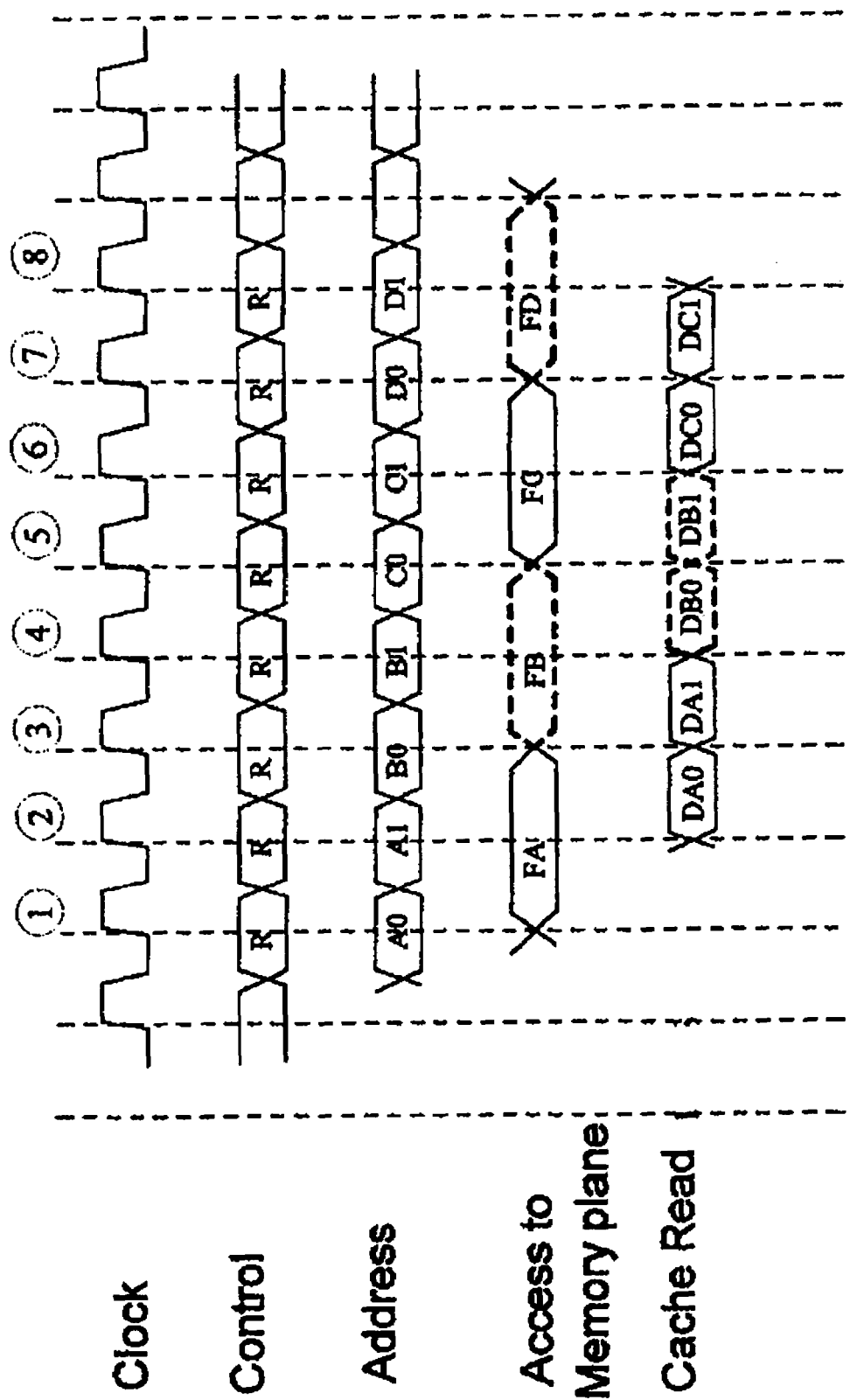
FIG. 4 illustrates the operation of the memory in reading mode.

FIG. 4 illustrates the operation of the memory in read mode. In the non-restrictive example, it is supposed that loading a page takes twice as long as the clock period. Moreover, in general, column requests (CAS) are shifted compared with line requests (RAS) to take into account the time necessary to load both buffer memories 5 and 6. Such shift is introduced by delay elements 114 and 116 that will preferably be realized by means of shift registers. In this chronogram, it is supposed that a buffer register read cycle can be performed at the same time as a read cycle of the memory matrix completes with loading into this buffer register. If this was not the case, buffer register reading could be delayed by one cycle.

As can be seen in FIG. 4, requests, which are read requests (R), are presented synchronously compared to a clock CK.

The third chronogram of FIG. 4 illustrates the address line, namely page addresses and column addresses of the words that are defined in said requests. In the example, read requests concern a series of two words (referenced A0 and A1) of an address page A, then two words B0 and B1 of an address B, then two words C0 and C1 of a page C, followed by two words D0 and D1 of a page D etc. . . . It should be noted that, according to a convention already adopted in the above mentioned patent, A0 means page <<A>> and word <<0>>.

The fourth chronogram illustrates accesses to memory plane 2. When a request for memory access is received, the corresponding page in the memory matrix is read only if this page is different from that of the preceding request, thanks to comparator 118 and memory element 119 that stores MSB of the received page address. Reading the page in the memory plane generally takes a relatively long time for reasons inherent in dynamic storage technology. The whole page is then loaded into one of buffer registers 5 and 6.

In FIG. 4, the access illustrated by FA shows that, in the clock cycle that follows the request for reading page A, the controller causes access to the memory plane in order to load the first required page A into buffer register 5. That corresponds to cycles 1 and 2 of FIG. 4.

Once buffer register 5 is loaded with the contents of a memory line, then it is possible to read or write very quickly in this register. Meanwhile, if needed, it is possible to load another page in the other cache register, or rewrite the contents of buffer register 6 to the memory if such contents were previously modified by writes.

In cycle 3 the memory plane is accessible again for a new request and, if necessary, a new page B can be loaded in the other buffer register, namely register 6. It is what occurs in the example illustrated in FIG. 4: the controller determined, from memory elements 119 and comparator 118, that the current request concerned another page and, consequently, it caused loading of this new page B in the second register 6 that was not used before and this new page becomes available two clock pulses later (cycle 5).

By convention, it will be noted that accesses relating to buffer register 6 are represented in dotted lines on all the chronograms whereas accesses relating to register 5 are drawn in full lines.

Read operations are then performed successively according to this principle, and it is seen that error correcting circuit 110 outputs a data flow DOUT, which is in theory free from bit error.

In the light of the chronograms of FIG. 4, It can already be noted the undeniable interest of the proposed structure when reading the memory in burst mode, i.e., successively at several addresses belonging to the same page. In this situation, a continuous flow of output data can be obtained from the memory, without any wait-states and this in spite of the error correction operations. In one embodiment, no read/modify/write operations are planned, for the ECC is only used to correct fixed flaws. Clearly, a mechanism could be provided that would correct "soft" type errors, namely errors caused by electromagnetic particles (particle alpha, in general) causing a nondestructive state change of a memory cell. In this case, the mechanism is similar to that described for write operations. That is possible if the time during which words of the same page are successively accessed is higher than the read cycle time of the matrix, and higher than twice the write cycle time of the main memory matrix. Generally, the operation of the memory structure is identical to that described in the above-mentioned patents for read operations.

The major advantage of the proposed memory structure appears in writing mode. Indeed, write request processing fully benefits from the possibilities of simultaneous read and write access of buffer registers 5 and 6. It is then possible to simultaneously address them for reads and writes at different addresses, owing to the fact that they both have a specific decoder/multiplexer unit (such as elements 106 and 103 for cache memory 5).

For clarity's sake, we will now consider operation of the embodiments of FIGS. 3A and 3B in writing mode in an example where the clock frequency is equal to the memory cycle time, and where a single page is accessed for writes in 2-word bursts. Clearly, this example is not the most interesting one and it will be noted that the best results regarding bandwidth gains are obtained in reference to FIG. 6.

Figure 5:
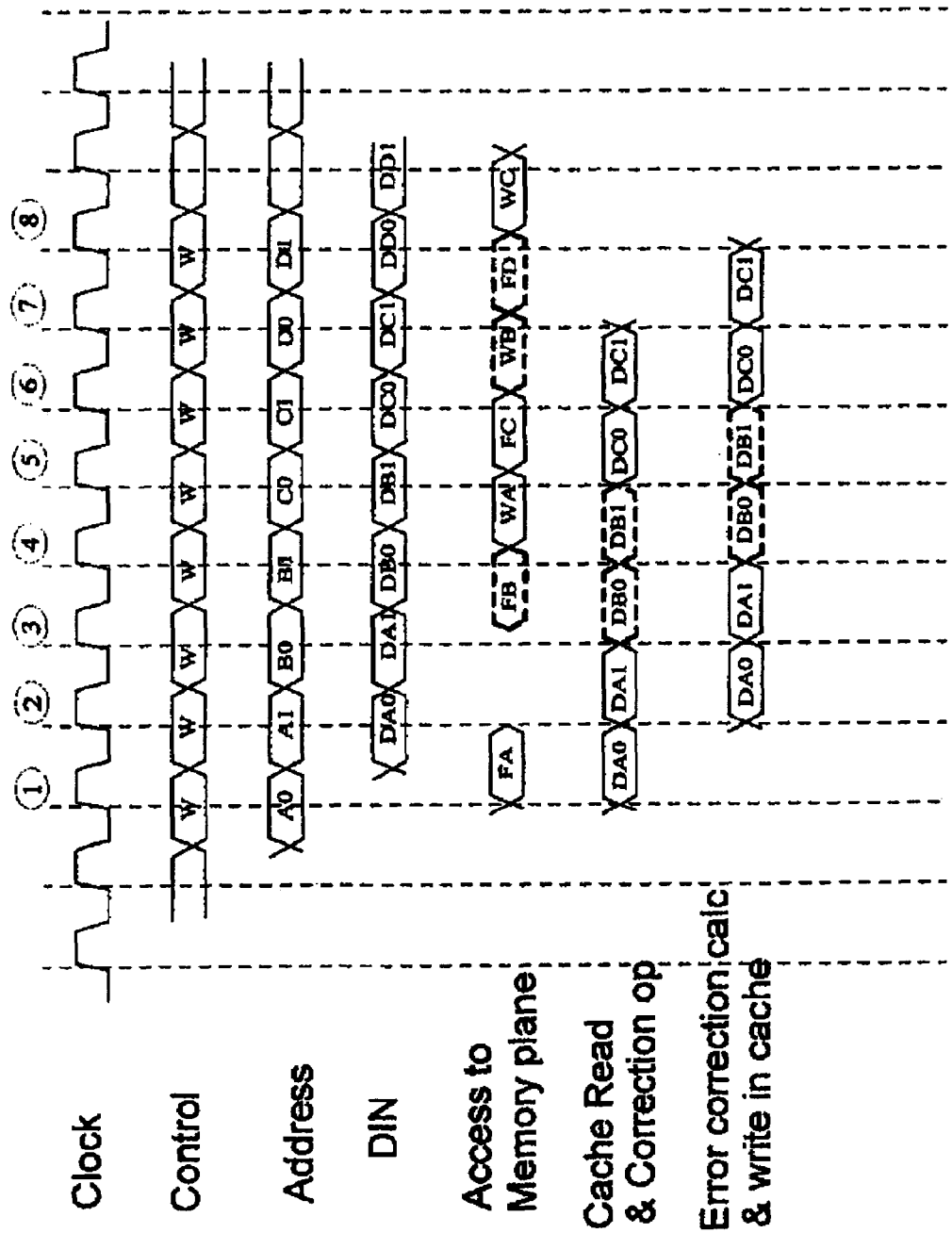
FIG. 5 illustrates the operation, in writing mode, of a memory comprising registers in accordance with FIGS. 3A and 3B in the case where the memory access time is lower than the clock cycle.

Nevertheless, FIG. 5 illustrates the principle of operation for a particularly simple case and for this reason it will be developed first. Again, for clarity's sake, it will be noted that it is supposed that a cache or buffer register read cycle can be performed at the same time that a read cycle in the memory matrix with loading in the same cache register completes. In the opposite case, reading of the storage register could be delayed by one cycle and it will be realized that it will be necessary either to carry out data modification and ECC code computation within the same cycle as the buffer read if the clock period allows it, by removing register 113, or use the technique that will be described in reference to FIG. 8 concerning the particular case of a buffer register write simultaneous with its write back into the matrix. Another solution consists in suspending, during 1 cycle every 2 bursts, the flow of input data to the memory.

When a write access to a page A that is not already present in cache registers 5 and 6 is requested, then this page is loaded into the register not being used, for example register 5. It is the operation represented by FA (Fetch A) in the chronogram entitled <<Access to the memory plane>> of FIG. 5 (cycle 1). Then the word to be modified is read and correcting circuit 110 performs, if necessary, correction of the word. At cycle 2, during the rising edge of the clock signal, the corrected word is stored in register 113, then the corresponding part of the word is replaced by the data to be written by means of the array of multiplexers 112-1 to 112-n, and a new ECC code is computed by circuit encoder 111. In parallel, a new write request (A1) is received. If the address of this request belongs—as it is the case in the example—in the same page, it is not necessary to access the memory plane again.

At clock cycle 3, the first corrected data (DA0) is written in cache register 5 during the rising edge of the clock, and second data (DA1) is modified. In parallel, a new request (corresponding to address B0) for a new page is received. State machine 105 then causes loading of this new address line into the second buffer register 6, and reads and corrects original data DB0. It is thus noted that there is simultaneously data writing to buffer register A and data reading in buffer register B, which is made possible by the dual port characteristic of cache registers 5 and 6.

At cycle 4, corrected data DA1 is written to register 5. As the preceding request addressed another page, it is known that the first burst is finished and the state machine 105 causes write back of register 5 in page A of the memory plane. This operation is noted WA ("Write Back" of word A) in the chronogram entitled <<Operation in memory plane>> of FIG. 5. A new access request to page B—already stored in register 6—is received and, in this case, it is useless to cause a new access to memory plane. It should be noted that, if this request had addressed a third page, state machine 105 would then have generated a wait signal transmitted to interface 115 in order to postpone processing of the request. It is noted that, in parallel to the preceding processing, data DB0 is modified.

As illustrated on the chronograms of FIG. 5, it is thus observed that it is possible to achieve a continuous flow of data while implementing the, error correcting mechanism. The system also works if the burst has a length greater than 2 clock periods. It is then not necessary to access the memory matrix in each cycle, which further reduces the system's power consumption. When the cycle time of the memory matrix is longer than the clock period, the system operates in the same way, by shifting data modification by one or more cycles. Again, a continuous flow of data is achieved, provided that bursts are longer than twice the cycle time of the memory plane.

Figure 6:
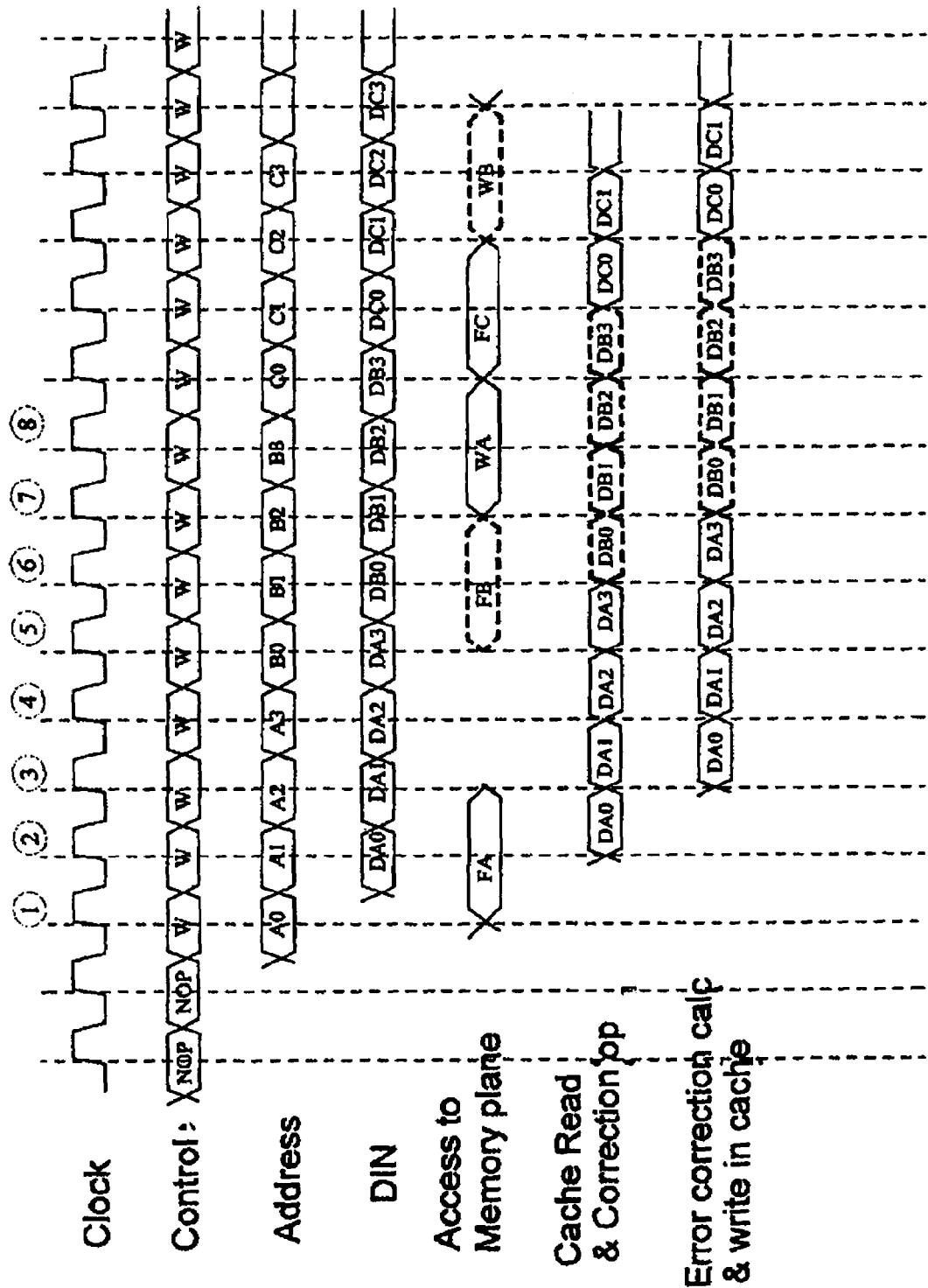
FIG. 6 illustrates the operation, in writing mode, of a memory comprising registers in accordance with FIGS. 3A and 3B in the case where the memory access time is higher than the clock cycle and lower than twice the clock cycle.

FIG. 6 illustrates the example of operation most representative of the benefits that can be brought by the structure memory according to the invention. It is an example of operation for a memory having a cycle time equal to twice the clock period, and again for registers of the same type as those of FIGS. 3A and 3B. In particular in the last two chronograms it can be seen that a continuous read and write data flow is really obtained, in the event of bursts on a single page.

Thus, as can be seen in the two described and illustrated examples, the memory structure according to the invention makes it possible to introduce an error correcting code while ensuring a large bandwidth: for writes as well as for reads it is possible to maintain continuous data flows from the moment when large bursts within the same page are obtained. Therefore it is possible to easily correct the component defects due to ageing. Indeed, it has been observed that most defects that appear because of the ageing of components are defects of the type <<single bit>>, so that the proposed memory structure makes it possible to correct these defects advantageously. An alternative solution to the burn-in technique is thus provided.

Moreover, it is noted that the error correcting mechanism works on several words forming a 128-bit unit. This greater size makes it possible to reduce the impact of the error correcting mechanism—in terms of allocated surface on silicon. Contrary to the use of a 6-bit correcting code for 32-bit words, by means of an 8-bit code it is then possible to correct an error occurring on a group of 4 words of 32 bits. This mechanism also allows a 32 or 64-bit microprocessor to byte-write without losing speed.

The dynamic memory structure that has been just described is particularly adapted to the realization of complex circuits comprising system on chips. Thanks to the error correcting mechanism the reliability of memories could be increased to such a point that it would even become possible to consider this mechanism as an alternative to the expensive burn-in solution.

It should be noted that the teachings of the invention could be further adapted to any traditional memory structure.

Figure 7:
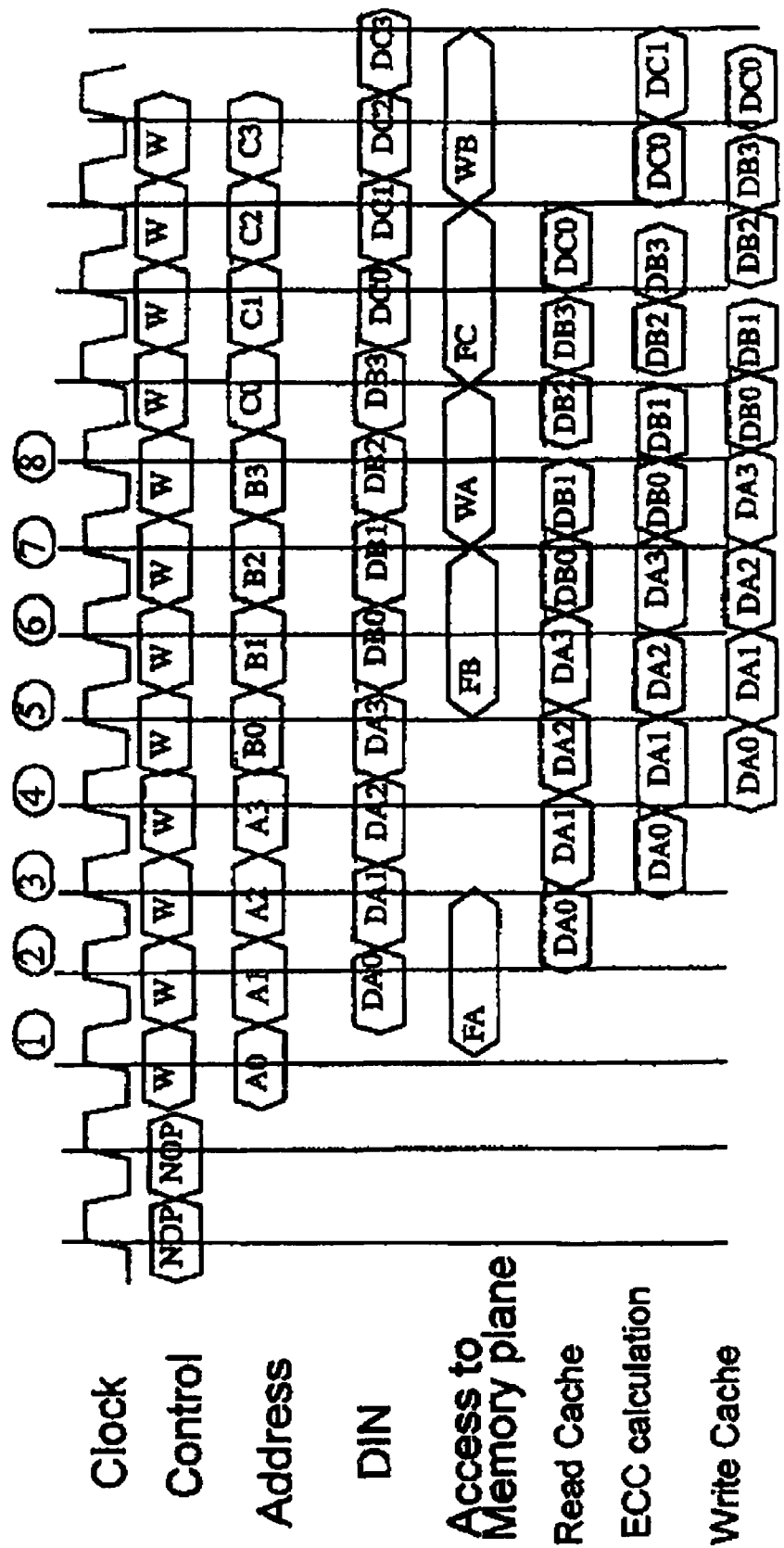
FIG. 7 illustrates the operation, in writing mode, of a memory comprising buffer registers in accordance with FIG. 3C and for a matrix cycle not exceeding twice the clock cycle.

FIG. 7 illustrates a representative chronogram for registers in accordance with FIG. 3C. Now buffer register write occurs one cycle after computation of the error correcting code.

Figure 8:
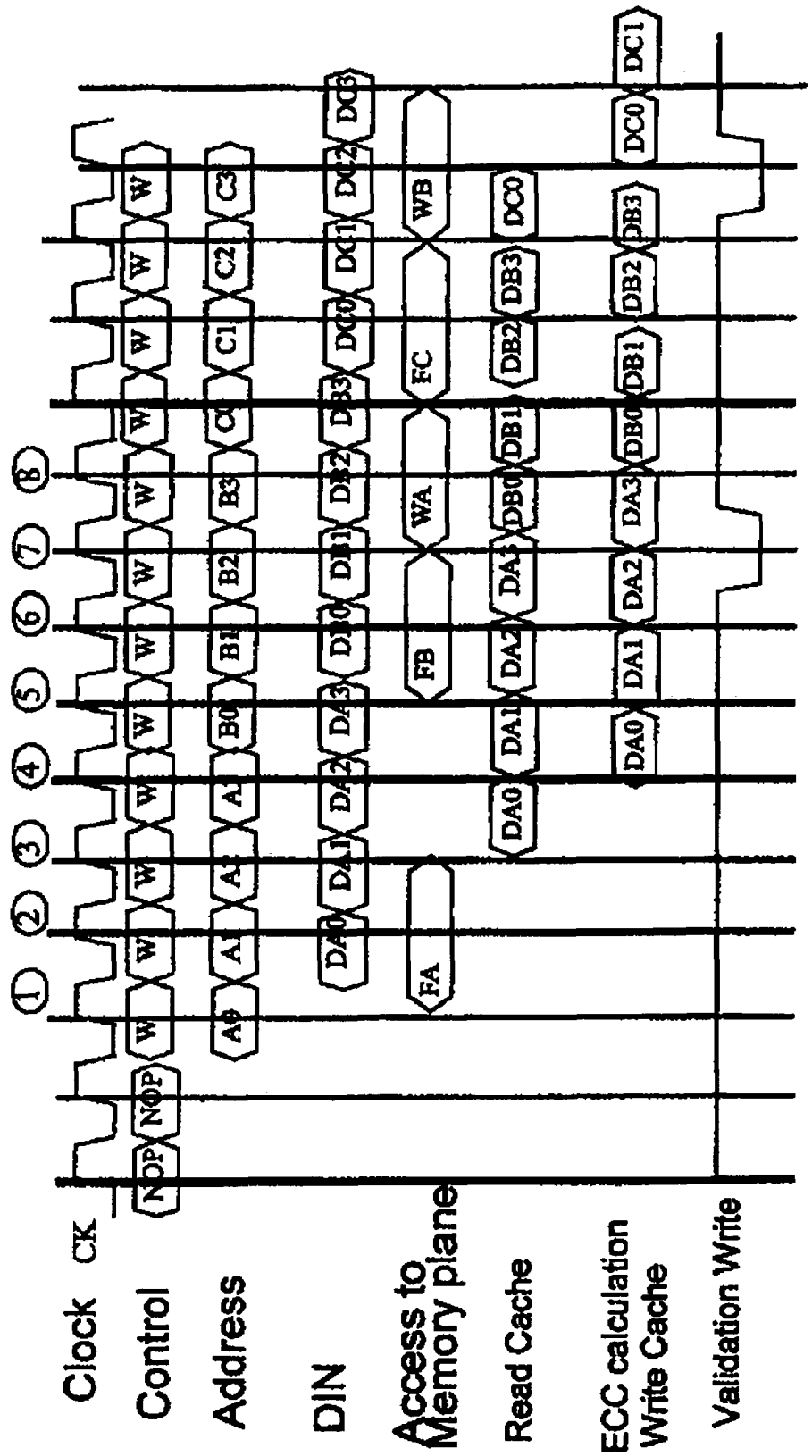
FIG. 8 illustrates a particular embodiment using a write enable signal making it possible to delay memory rewrite.

We will now describe a particular embodiment in reference to FIG. 8. In case the contents of the buffer register cannot be read in the same cycle that the matrix is read, or in case the clock period or cycle time of the memory matrix is such as it is not possible to read the memory matrix, to read the word in the buffer register and correct it in one cycle, it may be necessary either to shift reading of the buffer register by one cycle, or to use an additional error correction cycle.

In the first case, the diagram of FIG. 2 is not modified: controller 105 performs the buffer register read cycle one period later and elements 114 and 116 delay data for one more cycle.

Into the 2nd case, an additional pipeline register is inserted, for example between 108 and 110, or between 112 and 111, in order to distribute as well as possible reading/correction-modification/computation of new ECC code/writing in 3 clock cycles instead of 2.

But in both cases, writing back the buffer register to the memory matrix begins while the last burst data to write is received (FIG. 8). This is made possible by the following mechanism, in the most general case where the cycle time of the matrix is longer than the clock period:

An additional signal is introduced between controller 105 and the internal sequencer of the memory matrix: this signal indicates the validity of the contents of the buffer register to be written back to the matrix, and it is sampled during the rising edge of the clock.

For a write-back operation, the internal sequencer of the memory matrix the usually performs the following sequence: decoding address line, activating word lines, which causes the appearance of the signal on bit lines, then controlling read amplifiers and write amplifiers, then deactivating word lines, then returning bit lines to preload state.

With the introduction of this new signal, if, at the time when the internal sequencer of the matrix must control the write amplifiers, the signal indicates buffer data is valid, then the cycle goes on without interruption. If not, the sequencer waits until the signal becomes <<valid data>> before continuing the cycle.

When one wants to begin a matrix write back cycle while writing the last data of a burst to buffer, the validation signal is in an invalid state at the time of the write back command and goes to a valid state in the following cycle.

As indicated in FIG. 8, this allows writing of the last data of a burst while beginning buffer register write back to the memory matrix, if the cycle time of the memory is longer than the clock period.

In the particular case where the cycle time of the matrix is lower than the clock period, in practice it means that clock frequency is low. In this case, even if it is not possible to read the contents of the buffer within the same cycle as the matrix is read, it will be possible, by removing register 113, to carry out buffer reading, error correction, word modification and computation of the new ECC code in the same cycle. It is thus not necessary, in practice, to write to the buffer in the same cycle as write back of the buffer to the matrix.

In the invention, the error correcting mechanisms is used in combination with dual port memories for realizing buffer registers 5 and 6 in order to allow simultaneous write back operations and read, operations. Thus, it becomes possible, without altering bandwidth, to directly correct pages in the buffer registers by taking into account the error correcting code. Moreover, the error correcting mechanism concerns a word group—forming for example a group of 128 bits—in order to reduce the surface used on silicon. Consequently, the reliability of the dynamic memory is considerably increased by dint of a moderate increase in the semiconductor surface. Indeed, by computing the error correcting code with 128 bits for example, only a single 8-bit code is required whereas four 6-bit codes would have been necessary if a mechanism based on 32-bit words had been used.

The embodiments that have been described—in particular in reference to FIGS. 3A, 3B and 3C, make it possible to simultaneously submit a write column address and a read column address. We showed the great advantage that could be gained from such architecture, in particular when computing an error correcting code based on word groups.

Thus, by grouping a certain number of words for error correction computation one manages to minimize the space needed to install an error correcting mechanism. Moreover, this mechanism makes it possible to easily correct bit errors that characterize the defects of young dynamic memories. By inserting the error correcting mechanism within the memory, according to the present invention, one achieves an alternative solution to burn-in (burn-in being always expensive to implement).

The memory circuit of FIG. 2 has many potential applications. In particular it could be used for making a FIFO by coupling this memory with an adapted controller. The input port of the FIFO is then composed of the memory write port and the output port of the FIFO consists in the memory read port. When an output request is received, the controller loads the page containing the requested data into one of the buffer registers, in which this data is then read on the read port. In the same way, the data presented on the input port of the FIFO is written to the 2nd buffer register by means of the write port of the memory. When a write request corresponding to a new page is received, the contents of this 2nd buffer register is loaded into the memory matrix. Then there is a significant increase in the bandwidth—of about 30%—compared to a FIFO made with a memory having 2 buffer registers and only one port. A continuous flow, for reads as well as writes, can be obtained by using 4 buffer registers if burst length—i.e., the numbers of consecutive data belonging to the same page—is higher than twice the number of cycles necessary to access the memory matrix.

Figure 9:
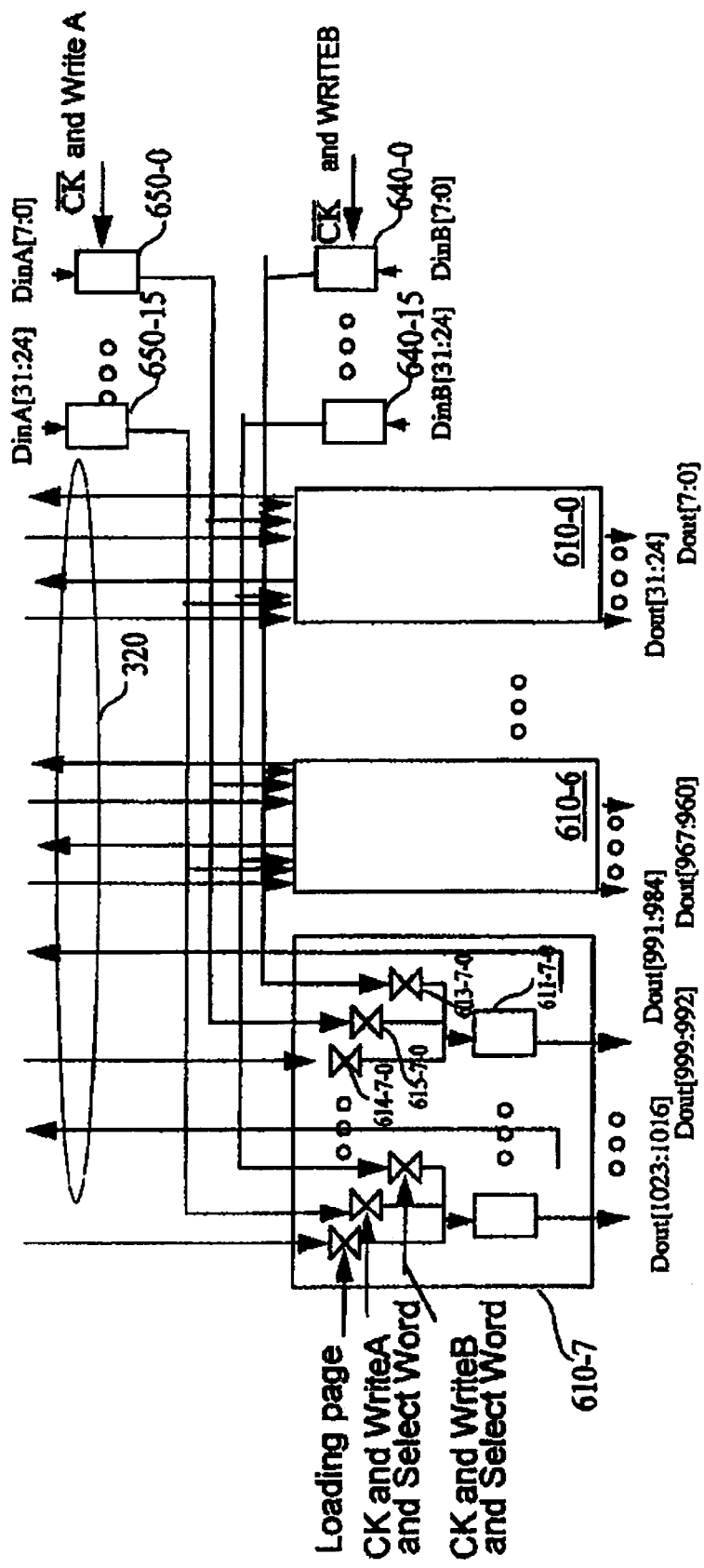
FIG. 9 illustrates an embodiment of a three-port register, allowing two simultaneous read accesses or two simultaneous write accesses.

FIG. 9 illustrates an improvement of the memory, which comprises buffer registers 5 and 6 having two undifferentiated read/write ports. As can be seen, the buffer register is organized in blocks 610-$i$ (with $i$ varying from 0 to 7) and each block, for example block 610-7 illustrated in FIG. 10, comprises sixteen registers 611-7-$j$ (varying from 0 to 15) constituting the slave part of a master/slave couple whose main element is composed of a register 650-$j$ (varying from 0 to 15) of a port A or a register 640-$j$ of a port B. Control of master registers 640-$j$ or 650-$j$ is ensured by a control signal constituted by the logical AND of an inverted clock signal and by a port activate signal.

With this new arrangement, each one of buffer registers 5 and 6 can be accessed indifferently in reading and/or writing mode.

Figure 10:
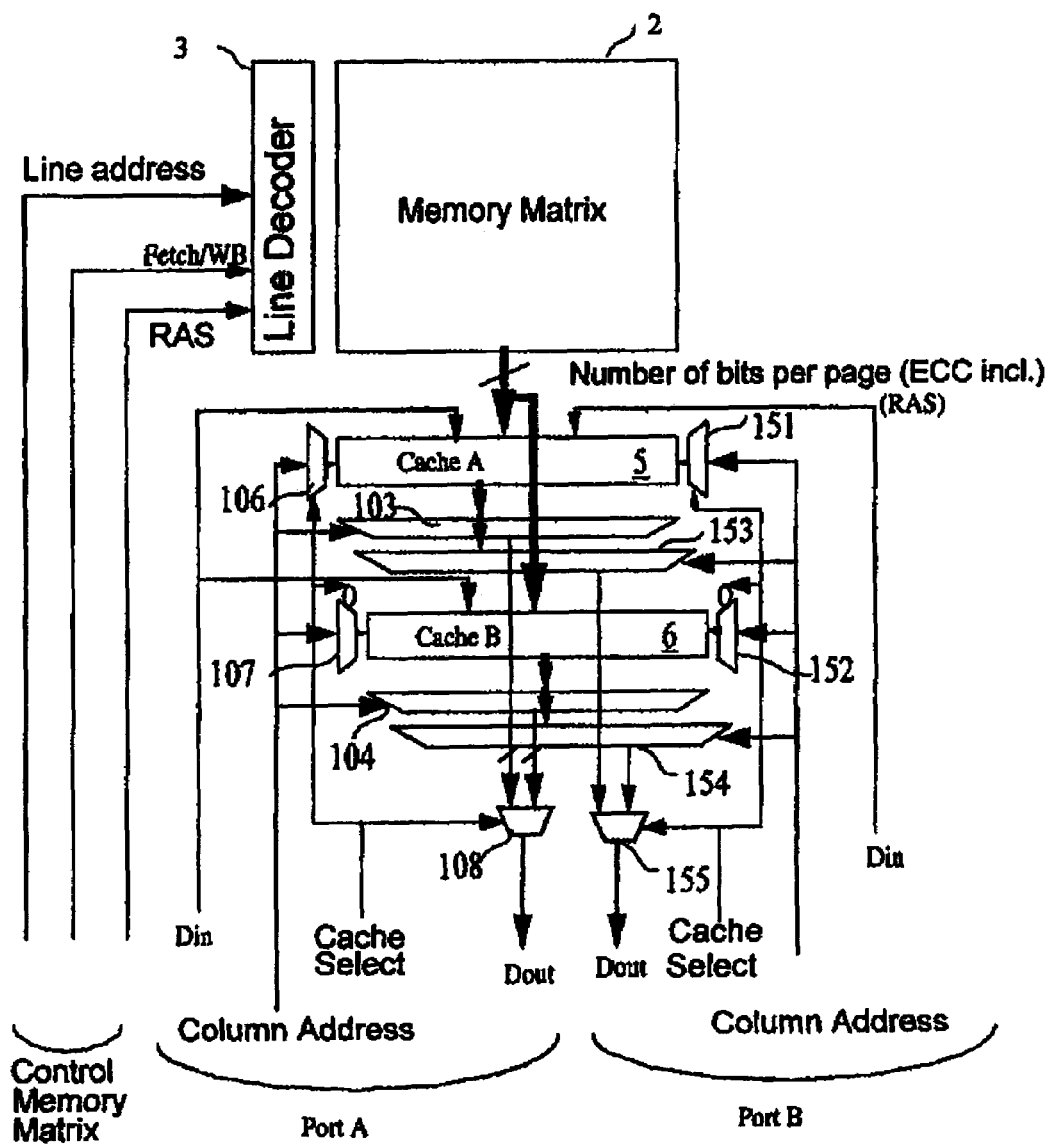
FIG. 10 illustrates the adaptation of the architecture of FIG. 2 to buffer registers having two undifferentiated read and write ports.

FIG. 10 illustrates the adaptation of the diagram of FIG. 2 to such buffer registers. There is again matrix 2, line decoder 3. The memory now comprises a column address decoder 106 (resp. decoder 107) for port A, identical to that represented in FIG. 2, and an address decoder 151 (resp. decoder 152) for the second port B.

The memory then comprises a multiplexer 103 for port A (identical to that of FIG. 2), and a dual multiplexer 153 assigned to the second port B.

The memory then comprises a multiplexer 104 for port A (identical to that of FIG. 2) and a multiplexer 154 assigned to port B.

Finally, the memory comprises a multiplexer 108 identical to that of FIG. 2—and assigned to port A—to which is associated a dual multiplexer 155 for port B.

It should be noted that register 120 of FIG. 2 (not shown in FIG. 10) is associated to a dual register as well.

As can be seen, thus one manages to realize a DRAM memory having two buffer registers for undifferentiated read and write access. With such a memory, all kinds of new particularly advantageous applications can be considered. The new memory allows communication with a processor and a, dedicated operator, as a codec for example, that can both be connected to the memory, each on one of its ports. A controller arbitrates between requests of both operators and loads (resp. writes back to the matrix) the requested pages into (resp. from) buffer registers, by dedicating one of the buffer registers to one operator and the other register to the other operator. Bursts can then be cut in short sub-bursts, to allow the microprocessor to have low latency for example, without having to reload the preceding page since it is still in the buffer register and without affecting bandwidth or consumption. In this manner, the bandwidth can be doubled compared to a single-port system, provided that a sufficiently great number of words of the same page are accessed successively in order to not be penalized by accesses to the memory matrix.

The invention has been described for words comprising eight bits and organized in word groups of 128 to which a correcting code is applied. However, it is clear that it is only an illustrative embodiment and that people qualified in the art could readily adapt the teachings of the invention to any organization of a dynamic memory page in word groups having an unspecified size, and in particular 16, 32 or 64 bits. In the same way the ECC could be applied to word groups having an unspecified size.

Finally it should be noted that the organization of an error correcting code on a group of words stored in a page is an element quite independent of the realization of buffer registers that could be of any kind, single-port like conventional registers in DRAM, or multiple-port as was previously described.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A dynamic random access memory circuit comprising:
    a memory plane composed of an array of memory cells arranged in lines and columns, and a line decoder, each line of said memory plane corresponding to a page of words;
    at least first and second buffer registers coupled with the memory plane allowing reading of words of a memory page and writing of new words to a page of the memory plane, said first and second buffer registers being used alternatively to access said memory;
    circuits associated with said first and second buffer registers in order to allow a simultaneous submission of a read column address and a write column address;
    an error correcting mechanism applied to word groups in order to reduce a silicon surface allocated to the error correcting mechanism;
    an error correcting circuit connected to an output of said at least first and second buffer registers and based on a correcting code applied to a group of n words constituting a sub-assembly of said page;
    a register connected to an output of said error correcting circuit to store said group of n words, after correction;
    an array of multiplexers for modifying a word within said group; and
    an encoder circuit for recomputing a new correcting code based on said modified group before storage thereof in one of said buffer registers.

2. The memory circuit according to claim 1 wherein the number of buffer registers is set to two, said buffer registers being usable indifferently for reading and writing and ensuring read-modify-write cycles to access the memory plane.

3. The memory circuit according to claim 1 further comprising:
    an interface circuit for receiving a memory access request comprising at least a page address and a column address, a read and write signal and, in the event of writes, data to be written;
    a circuit for comparing the page address of the current request with a page address of a preceding request;
    a circuit for storing the address of the current page it is different from the page address of the preceding page; and
    a circuit for causing a new access to the memory plane when the current page is different from the preceding page.

4. The memory circuit according to claim 1 wherein each page has a size of 1024 bits and wherein said encoder circuit and decoder circuit operate on 128-bit word groups.

5. A memory circuit comprising:
    an array of memory cells arranged in lines and columns, and a line decoder, each line of said memory plane corresponding to a page of words; and
    at least first and second buffer registers coupled with the array of memory cells for reading words of a page of the memory and writing new words to a page of the memory, said first and second buffer registers being used alternatively to access said memory; wherein said at least first and second buffer registers are mounted as dual-port memories allowing writing and simultaneous reading;
    an error correcting circuit coupled to an output of said at least first and second buffer registers and based on a correcting code applied to a group of n words constituting a sub-assembly of said page;

a register connected to an output of said error correcting circuit for storing said group of n words after correction;

a set of multiplexers for modifying a word within said group; and an encoder circuit for recomputing a new correcting code based on said modified group before storage thereof in one of said buffer registers.

* * * * *